(12) United States Patent
Chen et al.

(10) Patent No.: US 8,536,674 B2
(45) Date of Patent: Sep. 17, 2013

(54) INTEGRATED CIRCUIT AND METHOD OF FABRICATING SAME

(75) Inventors: Cheng-Po Chen, Niskayuna, NY (US); Emad Andarawis Andarawis, Ballston Lake, NY (US); Vinayak Tilak, Niskayuna, NY (US); Zachary Stum, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 172 days.

(21) Appl. No.: 12/973,097

(22) Filed: Dec. 20, 2010

(65) Prior Publication Data
US 2012/0153427 A1    Jun. 21, 2012

(51) Int. Cl.
*H01L 21/76* (2006.01)
*H01L 29/12* (2006.01)

(52) U.S. Cl.
USPC ............ 257/506; 257/77; 257/615; 257/510; 257/E21.541; 257/E21.542

(58) Field of Classification Search
USPC .................. 257/500, 513, 190, 192, E21.054, 257/E21.441, E21.541, E21.542, E29.261, 257/E29.089, 77, 510, 615, 506, E21.54; 438/221, 222, 223, 224
See application file for complete search history.

(56) References Cited

U.S. PATENT DOCUMENTS

| | | | |
|---|---|---|---|
| 3,725,683 A * | 4/1973 | Andersen | 327/440 |
| 3,766,438 A | 10/1973 | Castrucci et al. | |
| 3,966,577 A * | 6/1976 | Hochberg | 438/412 |
| 4,622,738 A | 11/1986 | Gwozdz et al. | |
| 5,386,135 A * | 1/1995 | Nakazato et al. | 257/369 |
| 5,436,174 A | 7/1995 | Baliga et al. | |
| 5,610,411 A | 3/1997 | Takasu | |
| 5,622,885 A * | 4/1997 | Merrill et al. | 438/220 |
| 6,218,895 B1 * | 4/2001 | De et al. | 327/566 |
| 6,743,665 B2 | 6/2004 | Park | |
| 7,015,549 B2 | 3/2006 | Kim et al. | |
| 7,196,392 B2 * | 3/2007 | Liu et al. | 257/500 |
| 7,301,223 B2 | 11/2007 | Rodney et al. | |
| 2002/0052102 A1 * | 5/2002 | Kiritani | 438/590 |
| 2003/0173638 A1 * | 9/2003 | Hayashi | 257/500 |
| 2004/0016977 A1 * | 1/2004 | Miyazaki et al. | 257/393 |
| 2005/0087842 A1 | 4/2005 | Forbes | |
| 2005/0233539 A1 | 10/2005 | Takeuchi et al. | |
| 2008/0191244 A1 | 8/2008 | Kim et al. | |
| 2009/0152645 A1 | 6/2009 | Tran | |
| 2011/0260245 A1 * | 10/2011 | Liu et al. | 257/337 |

* cited by examiner

*Primary Examiner* — Matthew W Such
*Assistant Examiner* — Scott Stowe
(74) *Attorney, Agent, or Firm* — Penny A. Clarke

(57) ABSTRACT

A method includes providing a substrate with at least one semiconducting layer. The method also includes forming a plurality of isolation barriers within the at least one semiconducting layer, thereby forming a plurality of device islands. The method further includes inserting a plurality of electronic devices into a portion of the at least one semiconducting layer such that each electronic device is substantially isolated from each other electronic device by the device islands.

3 Claims, 5 Drawing Sheets

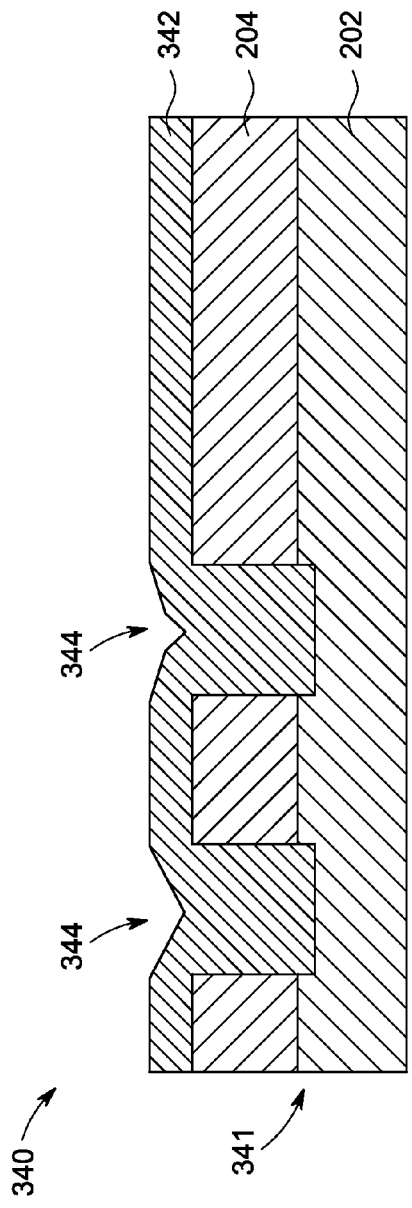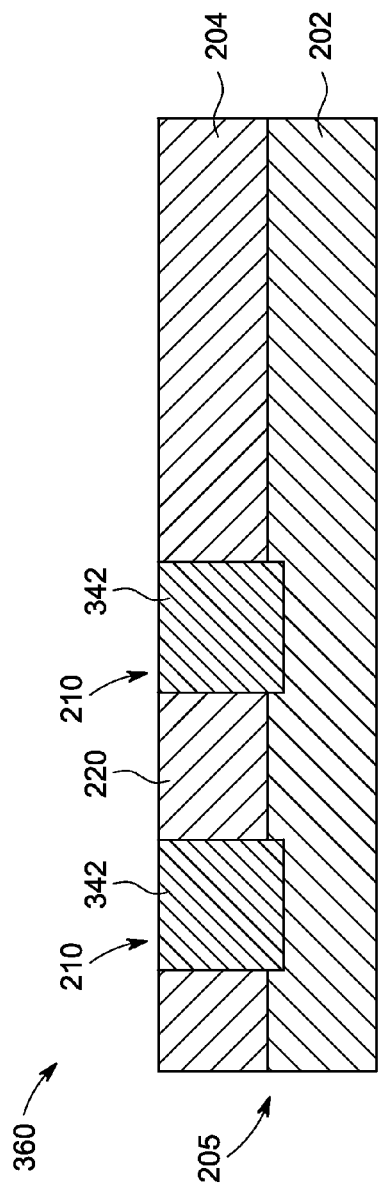

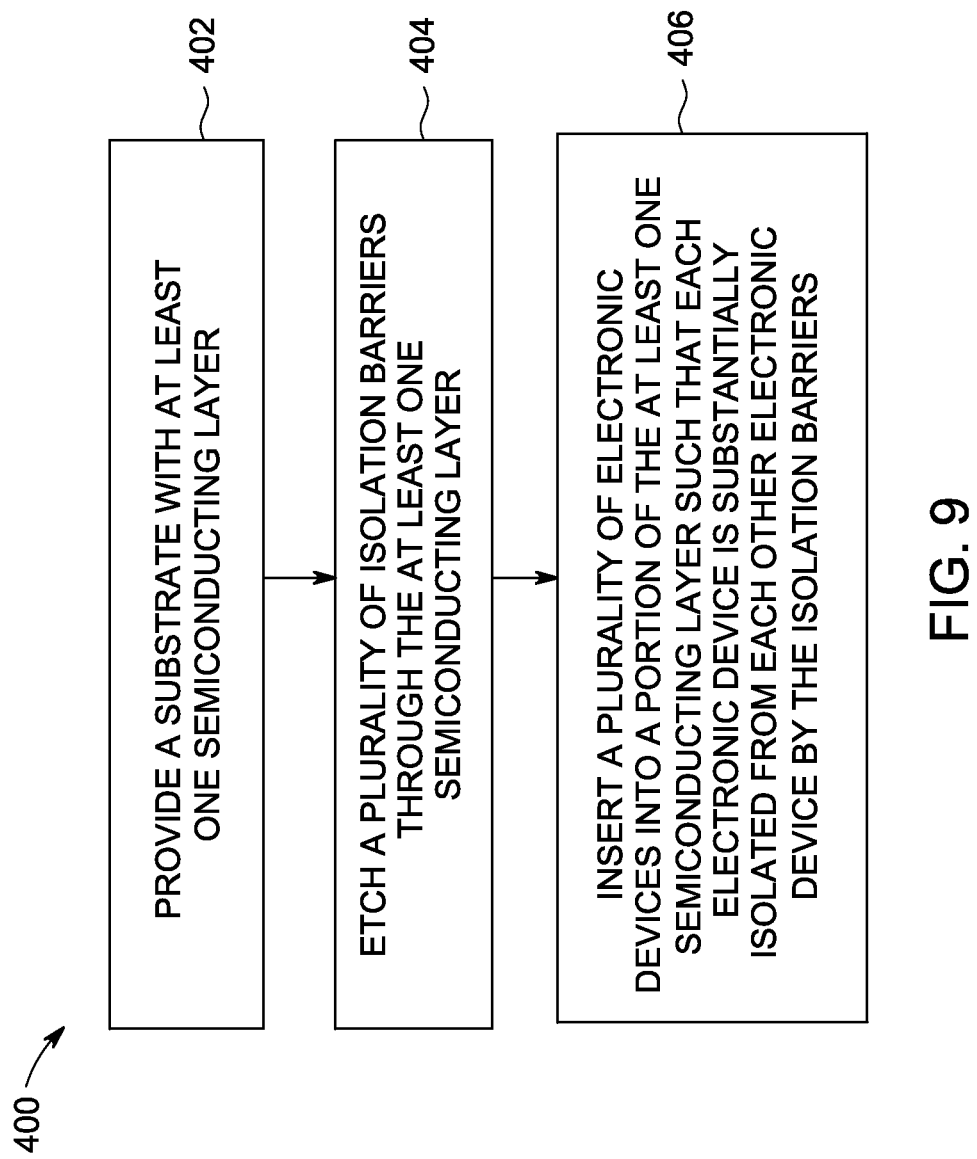

INTEGRATED CIRCUIT AND METHOD OF FABRICATING SAME

GOVERNMENT LICENSE RIGHTS

This invention was made with government support under contract DE-FG 36-08GO18181. The government has certain rights in the invention.

BACKGROUND

The subject matter described herein relates generally to integrated circuits and, more particularly, to methods and apparatus for fabricating integrated circuits that facilitate electrical isolation of components on a semiconductor wafer, chip, or die, and facilitate use of the integrated circuits in high-temperature environments.

At least some known silicon carbide (SiC) integrated circuits include a wafer substrate that includes at least one semiconducting layer. The substrate is sometimes referred to as the body and may be fabricated from a p-type material, an n-type material, and/or a semi-insulating material. Further, the SiC integrated circuits may, or may not, have an epitaxial layer formed on top of the substrate.

Many of these known SiC integrated circuits include a plurality of electronic devices, for example, transistors, resistors, and diodes, and include a body terminal embedded in a portion of the substrate. Such body terminals share the same substrate and are therefore substantially electrically coupled. However, the substrate can only be maintained at a single voltage and the body terminals of the transistors and the substrate are maintained at the lowest voltage potential of the plurality of transistors to facilitate proper operation of the integrated circuit. Energizing the substrate to a particular voltage is often referred to as back-biasing. The source terminals of each transistor can be energized to voltages different from the substrate. Therefore, the source-to-body voltage differential, i.e., $V_{SB}$, sometimes referred to as a reverse-bias voltage, is maintained at approximately 0 volts (V) or higher. Otherwise, if the body voltage exceeds a source voltage for a transistor, the body and source junction may operate as a diode and current paths will form between source terminals of different transistors, When the source voltage exceeds the body voltage, an incremental increase in $V_{SB}$ facilitates an incremental increase in the $V_{TH}$ of the transistor, thereby necessitating an incremental increase in a gate-to-source voltage ($V_{GS}$) to overcome the increased $V_{TH}$. Furthermore, an incremental increase in $V_{TH}$ of the transistor facilitates an incremental decrease in a drain-to-source (or, source-to-drain) current. Therefore, body voltage has an effect on the operation of the affected transistor, and the body acts as a second gate. Such effect is referred to as the "body effect".

In some known integrated circuits, in order to facilitate conditions such that $V_{SB}$ is a positive value, each transistor includes a hard-wired interconnection to each associated body terminal to attain the lowest voltage potential required for that particular set of transistors. These connections increase the interconnect complexity of the integrated circuit. The additional hard-wired interconnections increase the die area required for fabrication of the integrated circuit, decrease a yield per wafer, chip, or die, and increase a cost of integrated circuit fabrication.

Moreover, many known integrated circuits include other electronic devices, for example, resistive devices such as resistors that include resistive properties that are voltage and temperature dependent. Therefore, varying voltage conditions associated with the common substrate during dynamic operation of the integrated circuit induces variations in the resistance of the resistive devices, and thus detrimentally affects circuit performance. Furthermore, varying environmental conditions associated with the technical or industrial application of the integrated circuit may include significant temperature variations that will also vary the resistance. Anticipation of such varying circuit voltages and temperatures impose either more restrictive constraints on integrated circuit design and fabrication of the circuits, more restrictive constraints on industrial applications, or more complex and costly fabrication materials and techniques.

Furthermore, many known integrated circuits are limited to operating temperatures of approximately 175 degrees Celsius (° C.) (347 degrees Fahrenheit (° F.)), while many industrial applications include environments that exceed 175° C. Hardening integrated circuits to be more robust in such high-temperature environments significantly increases design and fabrication costs of such circuits.

BRIEF DESCRIPTION

In one aspect, a method includes providing a substrate with at least one semiconducting layer. The method also includes forming a plurality of isolation barriers within the at least one semiconducting layer, thereby forming a plurality of device islands. The method further includes inserting a plurality of electronic devices into a portion of the at least one semiconducting layer such that each electronic device is substantially isolated from each other electronic device by the device islands.

In another aspect, a device includes a substrate including at least one semiconducting layer. The device also includes a plurality of isolation barriers extending through the at least one semiconducting layer and defining at least one device island. The device also includes a plurality of electronic devices. At least one electronic device of the plurality of electronic devices is inserted onto the at least one device island.

In yet another aspect, an apparatus includes a base and a plurality of isolation barriers extending through at least a portion of the base. At least a portion of the plurality of isolation barriers defines a plurality of base islands. The apparatus also includes a plurality of electronic devices. At least one electronic device of the plurality of electronic devices is inserted onto each of the plurality of base islands.

BRIEF DESCRIPTION OF THE DRAWINGS

These and other features, aspects, and advantages of the presently described embodiments will become better understood when the following detailed description is read with reference to the accompanying drawings in which like characters represent like parts throughout the drawings, wherein:

FIG. 5 is a schematic view of a portion of the integrated circuit shown in FIG. 2 after a photolithography pattern is removed and the trenches are filled with a non-conductive material;

FIG. 6 is a schematic view of a portion of the integrated circuit shown in FIG. 2 that has been subjected to further etching;

FIG. 9 is a flow chart illustrating an example method used in fabricating the integrated circuit shown in FIGS. 2 and 7.

DETAILED DESCRIPTION

Figure 1:
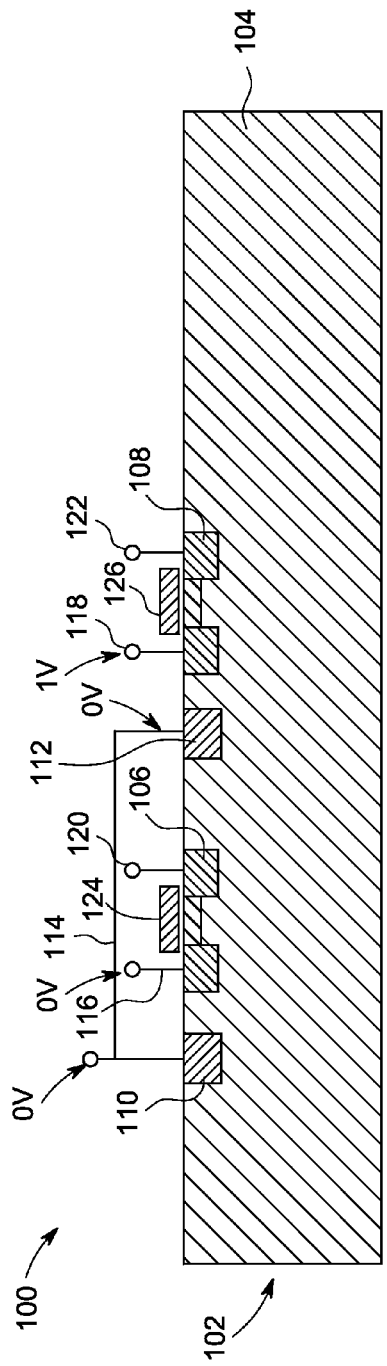
FIG. 1 is a schematic view of a prior art integrated circuit.

In the following specification and the claims, which follow, reference will be made to a number of terms, which shall be defined to have the following meanings The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The example integrated circuits and methods described herein may overcome disadvantages of known integrated circuits by defining a trench and/or a body well within a semiconducting layer between each individual electronic device positioned on the integrated circuit. The trenches and body wells can be formed using known methods of photolithography patterning and etching. The trenches can be filled with non-conductive materials that do not substantially increase costs of circuit fabrication. The body wells can be filled with a doped material that does not substantially increase costs of circuit fabrication. The trenches and body wells are isolation barriers. Each isolation barrier can surround a transistor, diode, or a resistor, thereby substantially eliminating electrical connectivity between a body terminal of a device and a body terminal of other devices. Such etching may be deep enough to extend through the semiconducting layer that houses the body of transistors and resistors, thus forming islands and isolating each device. Such island isolation may significantly reduce the body effect, i.e., the effect attained if a source terminal voltage exceeds a body voltage at which the substrate is maintained, thereby facilitating improvements in circuit performance.

Also, such isolation facilitates reducing a complexity of circuit interconnectivity, thereby potentially reducing an associated die area, facilitating an increase in yield per wafer, and facilitating a reduction of cost per die. Moreover, such isolation may facilitate a reduction of voltage variations in the vicinities of each resistor in the integrated circuit, thereby further facilitating improved circuit performance with varying operating conditions and further facilitating simplifying circuit design. Furthermore, decreasing voltage variations facilitates increasing functionality of integrated circuits in apparatus that include a wider tolerance range for varying temperatures, including extended high-temperature operations. Examples of such high-temperature apparatus include high-temperature tools and equipment for exploration of deep oil wells, in some case in conditions in excess of 175 degrees Celsius (° C.) (347 degrees Fahrenheit (° F.)), including temperatures that exceed 300° C. (572° F.), and in some cases, up to 500° C. (932° F.) for extended periods of time.

FIG. 1 is a schematic view of a prior art integrated circuit 100 that includes a silicon carbide (SiC) wafer substrate 102 that includes at least one semiconducting layer 104. The substrate is sometimes referred to as the body and may be fabricated from a p-type material, an n-type material, and/or a semi-insulating material. Further, integrated circuits 100 may, or may not, have an epitaxial layer formed on top of substrate 102.

Circuit 100 also includes a first electronic device, or transistor 106 embedded within substrate 102. Circuit 100 also includes a second electronic device, or transistor 108 embedded within substrate 102. Circuit 100 further includes a first body terminal 110 associated with first transistor 106 and a second body terminal 112 associated with second transistor 108. First body terminal 110 and second body terminal 112 are coupled to each other via a body terminal interconnection 114. Circuit 100 also includes a first source terminal 116 coupled to first transistor 106 and a second source terminal 118 coupled to second transistor 108. Circuit 100 further includes a first drain terminal 120 coupled to first transistor 106 and a second drain terminal 122 coupled to second transistor 108. Circuit 100 also includes a first gate terminal 124 coupled to first transistor 106 and a second gate terminal 126 coupled to second transistor 108.

First transistor 106 has a first threshold voltage, or $V_{TH1}$, wherein $V_{TH1}$ is the first gate-to-first source differential voltage at which a current path (not shown) between first source terminal 116 and first drain terminal 120 is formed such that electric current flows therebetween and first transistor 106 changes from an "off" state to an "on" state. Similarly, second transistor 108 has a second threshold voltage, or $V_{TH2}$, wherein $V_{TH2}$ is the second gate-to-second source differential voltage at which a current path (not shown) between second source terminal 118 and second drain terminal 122 is formed such that electric current flows therebetween and second transistor 106 changes from an "off" state to an "on" state.

In operation, first source terminal 116 is energized to a source voltage of approximately 0 volts (V) and first gate terminal 124 has a gate voltage of approximately 0V. Therefore, the differential voltage is approximately 0V which is less than $V_{TH1}$ and first transistor 106 is in an "off" state. As the gate voltage increases and the differential voltage between first gate terminal 124 and first source terminal 116, i.e., $V_{GS1}$ exceeds $V_{TH1}$, first transistor 106 changes to an "on" state. Also, in operation, second source terminal 118 is energized to a source voltage of approximately 1V and second gate terminal 126 has a gate voltage of approximately 1V. Therefore, the differential voltage between second gate terminal 126 and second source terminal 118, i.e., $V_{GS2}$, is approximately 0V which is less than $V_{TH2}$ and second transistor 108 is in an "off" state. As the gate voltage increases and $V_{GS2}$, exceeds $V_{TH2}$, second transistor 108 changes to an "on" state.

First body terminal 110 and second body terminal 112 share semiconducting layer 104 and are substantially electrically coupled, therefore, terminals 110 and 112 and semiconducting layer 104 can only be maintained at a single voltage. Body terminal interconnection 114 facilitates maintaining first body terminal 110, second body terminal 112, and semiconducting layer 104 at approximately 0V, thereby maintaining a source-to-body voltage differential, i.e., $V_{SB}$, sometimes referred to as a reverse-bias voltage, at approximately 0V for first transistor 106 and approximately 1V for second transistor 108, thereby subjecting second transistor 108 to the body effect as described herein. First body terminal 110, second body terminal 112, and semiconducting layer 104 are maintained at the lowest voltage potential of transistors 106 and 108 to facilitate proper operation of integrated circuit 100. Therefore, the lowest voltage of 0V is selected rather than 1V.

Otherwise, if the voltage of 1V were selected, the voltage of semiconducting layer 104 exceeds the voltage of 0V for first source terminal 116 for first transistor 106. In some circumstances, first body terminal 110 and first source terminal 116 cooperate to act in a manner similar to a diode and may forward-bias to facilitate electric current flow within semiconducting layer 104 and disrupt normal transistor operation.

Also, otherwise, if the voltage of 0V is selected, if base terminal interconnection 114 is not present, and if the voltage of second source terminal 118 is 1V, the voltage of second source terminal 118 exceeds the voltage of semiconducting layer 104. Such conditions give rise to the body effect. The incremental increase in $V_{SB}$ facilitates an incremental increase in $V_{TH2}$ of second transistor 108, thereby necessitating an incremental increase in second gate terminal 126-to-second source terminal 118 voltage ($V_{GS2}$) to overcome the increased $V_{TH2}$. Furthermore, an incremental increase in $V_{TH2}$ facilitates an incremental decrease in a second drain terminal 122-to-second source terminal 118 current (not shown). Therefore, the voltage of semiconducting layer 104 has an effect on the operation of affected second transistor 108, and semiconducting layer 104 acts as a second gate. Body terminal interconnection 114 facilitates maintaining body terminal 110 and 112 of transistor 106 and 108, respectively, at the lowest potential of integrated circuit 100. Such body terminal interconnection 114 increases the interconnect complexity of integrated circuit 100. Also, such additional hard-wired interconnections 114 increases a value of the die area required for fabrication of integrated circuit 100, decrease a yield per wafer, and increase a cost of fabrication of integrated circuit 100.

Figure 2:
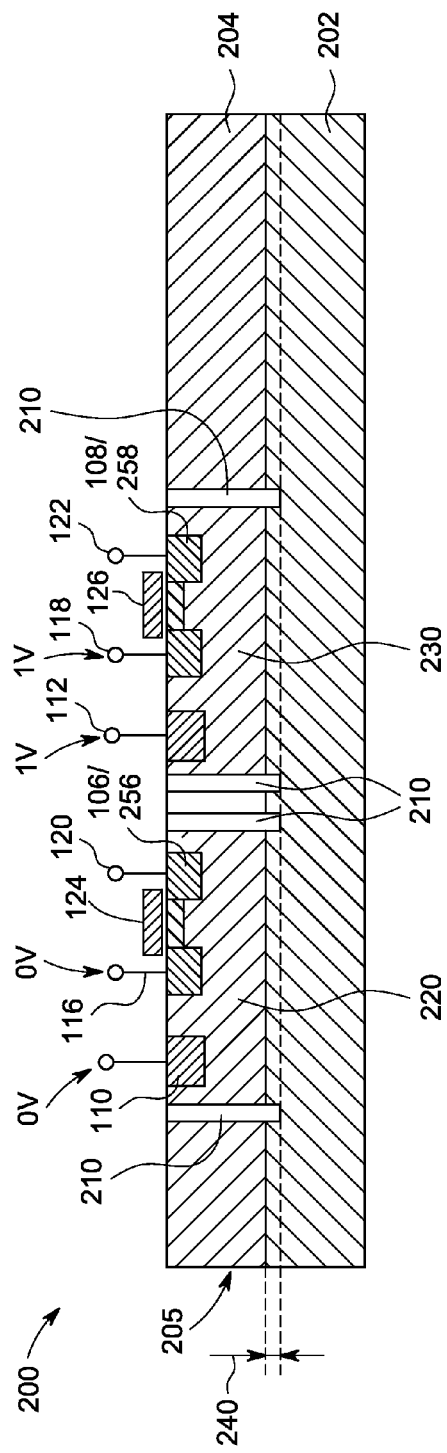
FIG. 2 is a schematic view of an example integrated circuit.

FIG. 2 is a schematic view of an example device, e.g., integrated circuit 200. In the example embodiment, circuit 200 includes a first semiconducting layer 202 and a second semiconducting layer 204 formed over a substantial portion of first semiconducting layer 202 to define a substrate 205, sometimes referred to as a base or a body. Also, in the example embodiment, first semiconducting layer 202 and second semiconducting layer 204, and therefore substrate 205, are formed from silicon carbide (SiC). Alternatively, layers 202 and 204, and therefore substrate 205 are formed from any semiconducting material that enables operation of integrated circuit 200 as described herein including, without limitation, gallium nitride (GaN), indium nitride (InN), and aluminum nitride (AlN). A plurality of isolation barriers, that is, substantially vertical trenches 210 are formed within substrate 205 and extend through second semiconducting layer 204. Body terminal interconnection 114 (shown in FIG. 1) is removed in FIG. 2 since first body terminal 110 and second body terminal 112 are not coupled to each other. Moreover, first body terminal 110 is energized with a voltage potential of 0V and second body terminal 112 is energized with a voltage potential of 1V.

In the example embodiment, trenches 210 are formed within substrate 205 to extend through second semiconducting layer 204 and at least some trenches 210 extend into first semiconducting layer 202 a distance 240 that is up to approximately 5 microns. Also, in the example embodiment, trenches 210 are positioned to surround a device, e.g., a transistor or a resistor, and define a plurality of device islands by breaking electrical connection between a body terminal of a device and those of other devices, and thus first transistor 106 may be substantially electrically isolated from second transistor 108. In one embodiment, first transistor 106 is positioned on first device island 220, second transistor 108 is positioned on second device island 230. In general, such electrical isolation facilitates each device on each device island to be back-biased at different potentials. Therefore, in the example embodiment, first device island 220 can be back-biased to a voltage of approximately 0V and second device island 230 can be back-biased to a voltage of 1V.

Forming trenches 210 to define first device island 220 and second device island 230 may facilitate substantially reducing deleterious consequences associated with the body effect. For example, threshold voltages for each device may be more stable with little variability. Also, for example, current flow through second semiconducting layer 204 associated with first device island 220 between first source terminal 116 and first drain terminal 120 may be substantially isolated to first transistor 106 and first device island 220. Similarly, current flow through second semiconducting layer 204 associated with second device island 230 between second source terminal 118 and second drain terminal 122 may be substantially isolated to second transistor 108 and second device island 230. Therefore, overall current flow through substrate 205 may be improved. Moreover, forming trenches 210 as described herein facilitates matching two similar devices in close physical proximity to each other since similar devices with similar operation may be candidates for positioning on one island together. Also, positioning similar devices on different islands facilitates each device operating in a substantially similar manner, thereby facilitating similar devices behaving in a consistent manner, also facilitating consistent operation of integrated circuit 200. Furthermore, elimination of such additional hard-wired interconnections, e.g., body terminal interconnection 114, facilitates decreasing the die area required for fabrication of integrated circuit 200, increasing a yield per wafer, and decreasing a cost of integrated circuit fabrication.

Further, in the example embodiment, first transistor 106 may be replaced by a first resistor 256 and second transistor 108 may be replaced by 258 to illustrate that resistors, as well as any other electronic device, including diodes, may be positioned on first device island 220 and second device island 230, respectively. Resistors 256 and 258 include resistive properties that are voltage and/or temperature dependent. Therefore, in the example embodiment, forming trenches 210 in substrate 205 facilitates substantially reducing varying voltage conditions associated with common second semiconductor layer 204 during dynamic operation of integrated circuit 200, therefore significantly reducing inducement of variations in the resistance of resistors 256 and 258 and, further, other resistances within integrated circuit 200.

Such reduction in resistance variations of integrated circuit 200 due to voltage variations facilitates a greater tolerance of varying environmental conditions associated with the technical or industrial application that integrated circuit 200 may be employed. Significant temperature variations will also vary the resistance of integrated circuit 200, however, in the example embodiment, integrated circuit 200 may be employed in environments with operating temperatures in excess of 175 degrees Celsius (° C.) (347 degrees Fahrenheit (° F.)), including temperatures that exceed 300° C. (572° F.), and in some cases, up to 500° C. (932° F.) for extended periods of time. Therefore, integrated circuit 200 may be embedded within high-temperature apparatus that include, without limitation, semiconductor wafers, chips, and dies. Moreover, integrated circuit 200 may be embedded larger-scale high-temperature apparatus that include, without limitation, high-temperature tools and equipment for exploration of deep oil wells.

Figure 3:
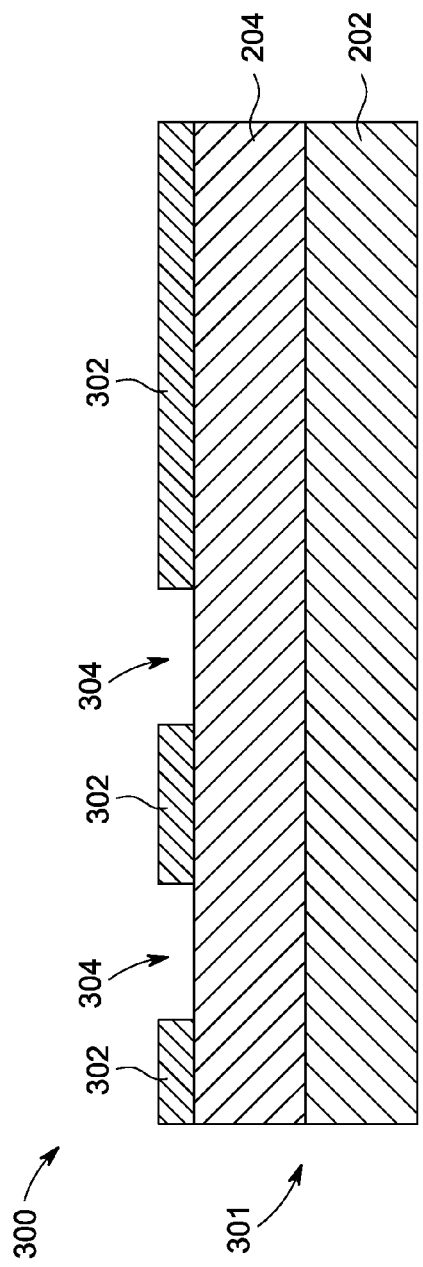
FIG. 3 is a schematic view of a portion of the integrated circuit shown in FIG. 2 that includes a pre-etched substrate including a first semiconducting layer and a second semiconducting layer.

FIG. 3 is a schematic view of a portion 300 of integrated circuit 200 (shown in FIG. 2) that includes a pre-etched substrate 301 including first semiconducting layer 202 and second semiconducting layer 204. Portion 300 also includes a pattern 302 that is, for example, photolithography-based, positioned on top of second semiconducting layer 204, thereby masking a portion of pre-etched substrate 301. Pattern 302 includes a plurality of unmasked, or target cutouts 304 formed therein to facilitate subsequent etching via, for example, and preferably, plasma etching.

Figure 4:
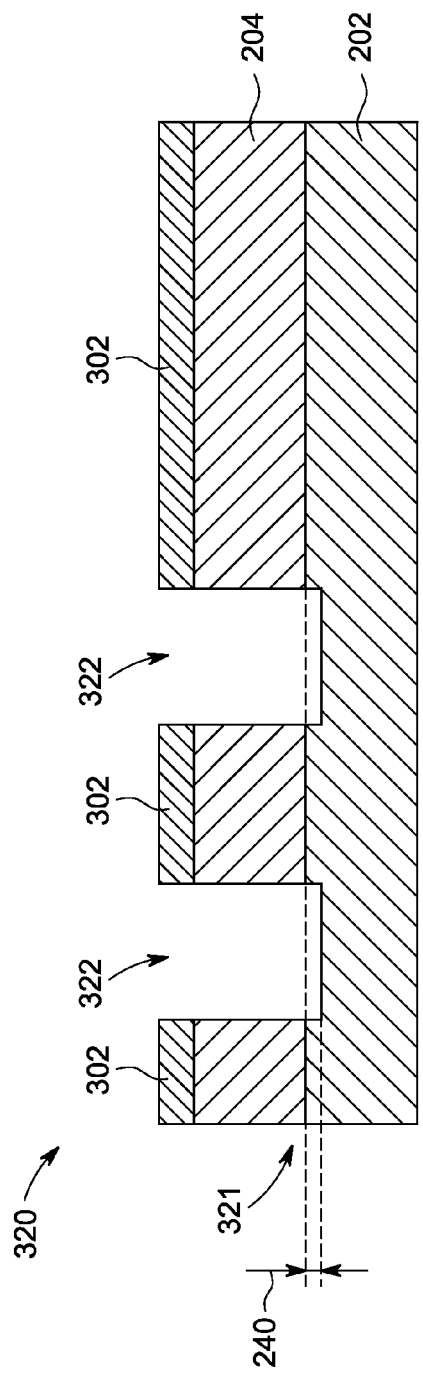
FIG. 4 is a schematic view of a portion of the integrated circuit shown in FIG. 2 that includes a plurality of trenches etched therein.

FIG. 4 is a schematic view of a portion 320 of integrated circuit 200 (shown in FIG. 2) that includes a plurality of trenches 322 etched therein. In the example embodiment, trenches 322 are formed within a trenched substrate 321 and extend through second semiconducting layer 204 and may extend up to approximately 5 microns into first semiconducting layer 202.

FIG. 5 is a schematic view of a portion 340 of integrated circuit 200 (shown in FIG. 2) after pattern 302 is removed and trenches 322 are filled with a non-conductive material 342. Portion 340 includes a filled base 341 including a layer of non-conductive material 342 formed on second semiconducting layer 204 such that filled base 341 includes filled trenches.

FIG. 6 is a schematic view of a portion 360 of integrated circuit 200 (shown in FIG. 2) that has been subjected to further etching. Non-conductive material 342 is planarized, i.e., a portion of non-conductive material 342 is removed from the surface of second semiconducting layer 204 and filled trenches 210 are substantially planar with second semiconducting layer 204. Alternatively, any method of planarizing filled trenches 210 that enables operation of integrated circuit 200 as described herein is used including, without limitation, polishing, wet etching, and non-plasma etching of non-conductive material 342. First device island 220 is sufficiently formed to facilitate receipt of first transistor 106 or first resistor 256 (both shown in FIG. 2) thereon.

Figure 7:
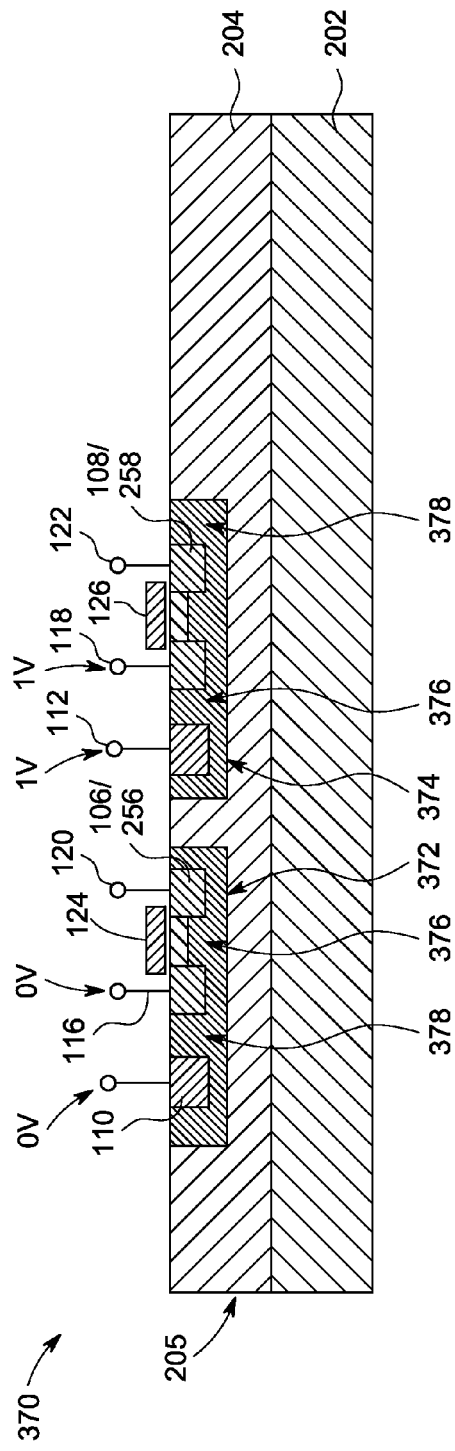
FIG. 7 is a schematic view of an alternative example integrated circuit.

FIG. 7 is a schematic view of an alternative example integrated circuit 370. Integrated circuit 370 is similar to integrated circuit 200 (shown in FIG. 2) with the exception that integrated circuit 370 includes a first alternative device island 372 and a second alternative device island 374. Instead of plurality trenches 210 (shown in FIG. 2) formed within base 205, a plurality of isolation barriers, that is, body wells 376 are formed within second semiconducting layer 204. Body wells 376 are filled with a doped material 378 that includes dopants such as, without limitation, phosphorous, nitrogen, boron, and aluminum. Device islands 372 and 374 are doped with materials that are similar to device body terminals 110 and 112, that is, doped materials 378 are either an n-type or a p-type. However, doped materials 378 are a different type than that of second semiconducting layer 204, thus facilitating formation of device islands 372 and 374 in second semiconducting layer 204. In the example embodiment, the concentration of doping material 378 is substantially homogeneous within a range of approximately 1e15 dopant atoms per cubic centimeters ($cm^3$) to approximately 1e20 dopant atoms per $cm^3$. In the exemplary embodiment, device islands 372 and 374 extend approximately 10 microns into second semiconducting layer 204. Alternatively, device islands 372 and 374 extend any depth into second semiconducting layer 204 that enables operation of integrated circuit 370 as described herein including, without limitation, less than 10 microns.

Figure 8:
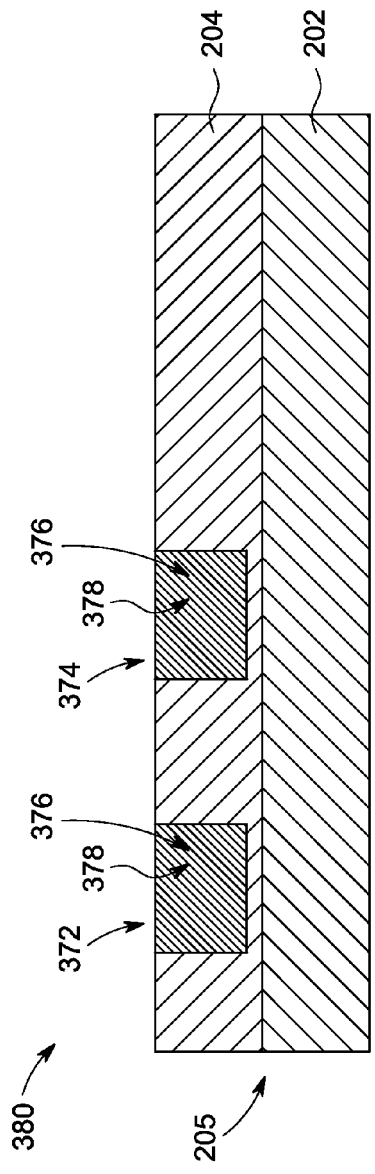
FIG. 8 is a schematic view of a portion of the integrated circuit shown in FIG. 7 after a photolithography pattern is removed and the body wells are filled with a doped material.

FIG. 8 is a schematic view of a portion 380 of integrated circuit 370 (shown in FIG. 7) after a photolithography pattern is removed and body wells 376 are filled with doped material 378. In a manner similar to that for integrated circuit 200, second semiconducting layer 204 is masked using lithography. Body wells 376 are formed by doping of portions of second semiconducting layer 204. Doped material 378 is incorporated directly into body wells 376 using methods that include, without limitation, implantation and diffusion.

FIG. 9 is a flow chart illustrating an example method 400 used in fabricating integrated circuit 200 (shown in FIG. 2). In the example embodiment, substrate 205 (shown in FIG. 2) with at least one semiconducting layer, e.g., first semiconducting layer 202 and second semiconducting layer 204 (both shown in FIG. 2), is provided 402. A plurality of isolation barriers, that is, a plurality of trenches 210 (shown in FIG. 2) or a plurality of body wells 376 (shown in FIG. 7) are etched 404 through second semiconducting layer 204, thereby forming a plurality of device islands 220 and 230 (both shown in FIG. 2) or device islands 372 and 374 (both shown in FIG. 7). A plurality of electronic devices 106, 108, 256, and 258 (all shown in FIGS. 2 and 7) are inserted 406 into a portion of second semiconducting layer 204 such that each electronic device 106 and 256 is substantially isolated from each electronic device 108 and 258 by device islands 220 and 230 and/or device islands 372 and 374.

The above-described integrated circuits and methods of fabrication may overcome disadvantages of known integrated circuits by defining an isolation barrier within a semiconducting layer between each individual electronic device positioned on the integrated circuit. The isolation barriers can be formed using known methods of patterning and etching. The isolation barriers may include trenches that may be filled with non-conductive materials that do not substantially increase costs of circuit fabrication. The isolation barriers may also includes body wells that may be filled with a doped material that does not substantially increase costs of fabrication. Each isolation barrier may surround a transistor or a resistor, thereby substantially eliminating electrical connectivity between a body terminal of a device and a body terminal of other devices. Such etching may be deep enough to extend through the semiconducting layer that houses the body of transistors and resistors, thus forming islands and isolating each device. Such isolation significantly reduces the body effect, thereby facilitating improvements in circuit performance. Also, such isolation facilitates reducing a complexity of circuit interconnectivity, thereby potentially reducing an associated die area, facilitating an increase in yield per wafer, and facilitating a reduction of cost per die. Moreover, such isolation may facilitate a reduction of voltage variations in the vicinities of each resistor in the integrated circuit, thereby further facilitating improved circuit performance with varying operating conditions and further facilitating simplifying circuit design. Furthermore, decreasing voltage variations facilitates increasing functionality of integrated circuits in apparatus that include a wider tolerance range for varying temperatures, including extended high-temperature operations. Examples of such high-temperature apparatus include high-temperature tools and equipment for exploration of deep oil wells, in some case in conditions in excess of 175 degrees Celsius (° C.) (347 degrees Fahrenheit (° F.)), including temperatures that exceed 300° C. (572° F.), and in some cases, up to 500° C. (932° F.) for extended periods of time.

Example embodiments of integrated circuits and methods for fabricating such integrated circuits are described above in detail. The integrated circuits and fabrication methods are not limited to the specific embodiments described herein, but rather, devices of integrated circuits and/or steps of the fabrication methods may be utilized independently and separately from other devices and/or steps described herein. For example, the integrated circuits and methods may also be used in combination with other electronic devices and fabrication methods, and are not limited to practice with only the integrated circuits as described herein. Rather, the example embodiment can be implemented and utilized in connection with many other electronic system and fabrication applications.

Although specific features of various embodiments of the invention may be shown in some drawings and not in others, this is for convenience only. Moreover, references to "one embodiment" in the above description are not intended to be interpreted as excluding the existence of additional embodiments that also incorporate the recited features. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus comprising:
    a base comprising a first semiconducting layer and a second semiconducting layer extending over a portion of said first semiconducting layer, wherein at least one of the first and second semiconducting layers is formed from at least one of silicon carbide, gallium nitride, indium nitride, and aluminum nitride;
    a plurality of isolation barriers extending through at least a portion of said base, wherein at least a portion of said plurality of isolation barriers defines a plurality of base islands, wherein the isolation barriers comprise at least one of: (i) a plurality of trenches substantially defined within the second semiconducting layer, each of the trenches extending to the first semiconducting layer; and (ii) a plurality of body wells substantially defined within the base;
    a first transistor positioned on a first base island, wherein said first transistor comprises a first body terminal at a first voltage; and
    a second transistor positioned on a second base island, wherein said second transistor comprises a second body terminal at a second voltage, said first transistor and said second transistor being substantially electrically isolated from each other.

2. An apparatus in accordance with claim 1, wherein said plurality of trenches are at least partially filled with a non-conductive material therein.

3. An apparatus in accordance with claim 1, wherein said plurality of body wells are at least partially filled with a doped material therein.

* * * * *